United States Patent [19]
Yoshitake et al.

[11] Patent Number: 5,909,030
[45] Date of Patent: Jun. 1, 1999

[54] PATTERN TRANSFER APPARATUS, AN OPERATION MANAGEMENT SYSTEM THEREOF, AND AN OPERATION MANAGEMENT SYSTEM FOR A SEMICONDUCTOR MANUFACTURE APPARATUS

[75] Inventors: Shusuke Yoshitake; Masamitsu Itoh, both of Yokohama; Tadahiro Takigawa, Kawasaki, all of Japan

[73] Assignee: Kabushiki Kaisha Toshiba, Kawasaki, Japan

[21] Appl. No.: 08/907,415

[22] Filed: Aug. 7, 1997

[30] Foreign Application Priority Data

Aug. 8, 1996 [JP] Japan ................................. 8-209434

[51] Int. Cl.[6] .................................................. H01L 21/00
[52] U.S. Cl. ............................ 250/492.2; 355/53; 355/76
[58] Field of Search .......................... 250/492.2; 355/53, 355/76

[56] References Cited

U.S. PATENT DOCUMENTS 4,757,355  7/1988  Iizuka et al. ............................ 355/53
4,924,258  5/1990  Tsutsui .................................... 355/0

FOREIGN PATENT DOCUMENTS 2224136  4/1990  United Kingdom ..................... 355/76

*Primary Examiner*—Jack I. Berman
*Attorney, Agent, or Firm*—Oblon, Spivak, McClelland, Maier & Neustadt, P.C.

[57] ABSTRACT

The pattern transfer apparatus includes a first substrate on which a circuit pattern of an arbitrary semiconductor device is drawn, a first stage including a substrate holding mechanism for holding the first substrate, an illumination optical system for illuminating the circuit pattern of the semiconductor device drawn on the first substrate, a second stage on which a second substrate can be mounted, a reducing optical system or an equimultiple optical system for transferring a part of the circuit pattern of the semiconductor device drawn on the first substrate, and a mechanism for moving at least one of first and second elements, the first element being one of the first and second stages and the second element being the reducing optical system or an equimultiple optical system, wherein the first stage has a holding mechanism for holding one of substrates of at least two sizes and for changing a gripping force in accordance with the sizes of the substrates.

11 Claims, 8 Drawing Sheets

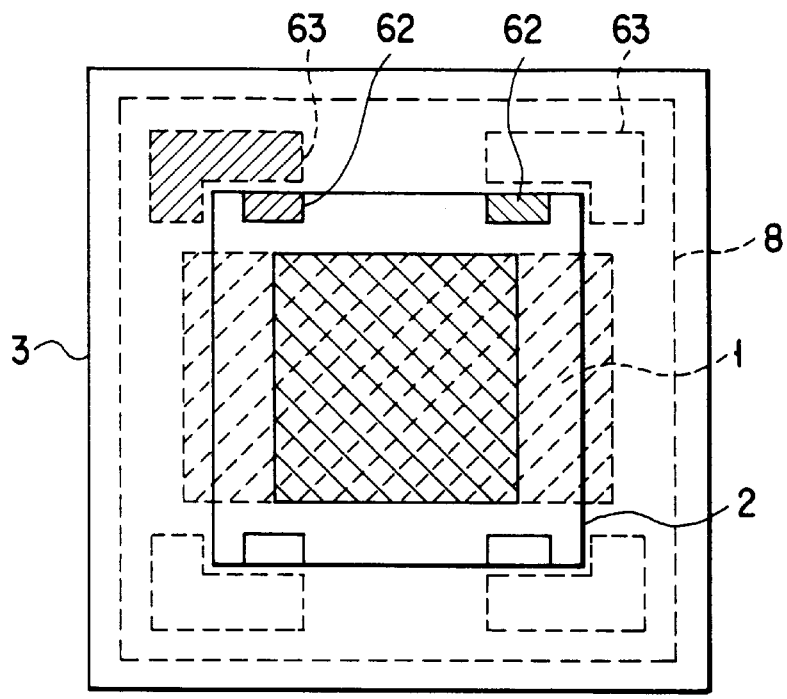
F I G. 10A
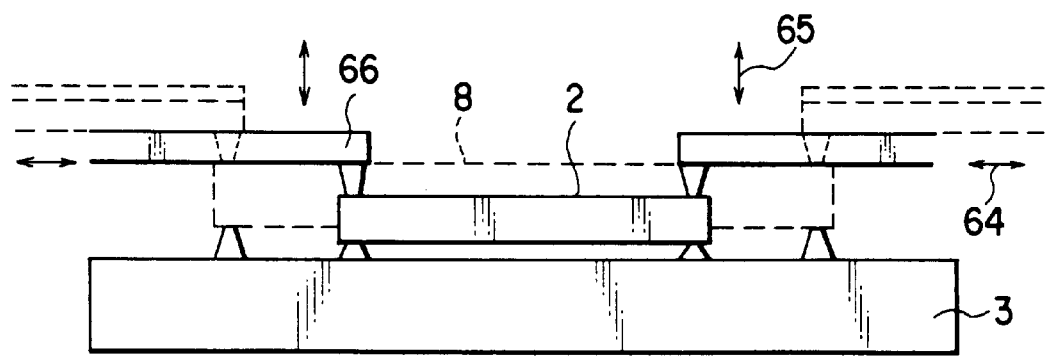
F I G. 10B

PATTERN TRANSFER APPARATUS, AN OPERATION MANAGEMENT SYSTEM THEREOF, AND AN OPERATION MANAGEMENT SYSTEM FOR A SEMICONDUCTOR MANUFACTURE APPARATUS

BACKGROUND OF THE INVENTION

The present invention relates to a pattern transfer apparatus for transferring a circuit pattern of a semiconductor apparatus onto a substrate to be processed, and a management system thereof.

In recent years, as integration of LSIs has been developed, a critical dimension (CD) of the circuit required for a semiconductor device has become smaller and smaller. The following table 1 shows a trend of semiconductor devices (DRAMs and LOGICs).

TABLE 1

Trends of Semiconductor Device

| | | | | | |
|---|---|---|---|---|---|
| RESOLUTION ($\mu$m) | 1995 | 1998 | 2001 | 2004 | 2007 |
| | 0.35 | 0.25 | 0.18 | 0.13 | 0.10 |
| DRAM (bits) Chip Size | 64 M | 256 M | 1 G | 4 G | 16 G |
| DRAM (mm × mm) | 10 × 20 | 12 × 24 | 15 × 30 | 18 × 36 | 22 × 44 |
| LOGIC (mm × mm) | 16 × 16 | 18 × 18 | 19 × 19 | 21 × 21 | 23 × 23 |
| MASK MAGNIFICATION | 5X | 4X | 4X | 4X | 4X |
| MASK PATTERN POSITION PRECISION (nm) | 70 | 44 | 32 | 26 | 18 |
| MASK PATTERN LINE WIDTH UNIFORMITY (nm) | 50–35 | 40–25 | 30–18 | 20–13 | 16–10 |

Manufacture of these semiconductor devices generally adopts the following method. Specifically, a mercury-vapor lamp and xenon-vapor lamp (g-line or I-line), or a deep ultraviolet source (KrF or ArF) having a short wavelength is used as a light source, and any of several kinds of original masks, on which a desired circuit pattern is formed, is positioned with high precision with respect to a wafer. Thereafter, the pattern is minified and transferred onto an exposure region on the wafer at a magnification of ⅕ or ¼. Discussion has been made about a possibility that an exposing apparatus (or pattern transfer apparatus) using a soft X-ray having a wavelength of about 1 nm or an electron beam direct drawing apparatus may be substituted for optical lithography, with respect to a pattern which has a size of 1 $\mu$m or less, due to resolution limits from wavelengths of light. However, there has been a prospect that optical lithography can work effectively in the generation of 1 G-bit DRAM and at the beginning of 4 G-bit DRAM, because of progress of optical lithography techniques.

As long as an exposing apparatus is concerned, such optical lithography techniques have improved the performance in precision or times to align a mask with a wafer by reconsideration of alignment methods of TTL (Through The Lens) or TTR (Through The Reticle) and alignment algorithms of EGA (Enhanced Global Alignment). Those techniques have also achieved a high throughput (i.e., the number of wafers exposed per unit time) by improvements in apparatuses, i.e., preparing wafer stages with a higher speeds and higher precision, by adopting frictionless guides for stage components and reducing weights of stages.

In addition, attempts to further improve the resolution and the depth of focus and process developments such as a surface imaging method and the like have been made, by adopting super-resolution exposure techniques represented by a phase-shift mask, an off-axis illumination method, a pupil plain filtering method, and the like.

Meanwhile, as a result to have increased a pattern area of a semiconductor device accordingly as the integration has been improved, a large aperture lens 31 for transferring a circuit pattern area 30 on a mask 34, as shown in FIG. 1A has been required. The following table 2 shows the relationship between the chip size and the lens aperture required.

TABLE 2

Chip Size and Required Lens Aperture

| | | | | | |
|---|---|---|---|---|---|
| Chip Size/2 Chip DRAM (mm × mm) | 20 × 20 | 24 × 24 | 30 × 30 | 36 × 36 | 44 × 44 |
| 4x Mask Transfer Lens Aperture (mm) | 113 | 136 | 170 | 204 | 249 |

The larger the chip size is, the larger the lens aperture required. Further, in accordance with improvements in resolution, demands have arisen for lenses having less distortion over the entire exposure surface. However, as indicated in "Super Precision Process Technique (First Volume), p. 106, 1993", it is very difficult to prepare a large aperture lens having less distortion over the entire exposure surface than a conventional lens.

However, by scanning an exposure surface 32 like a rectangular slit as shown in FIG. 1B in the direction indicated by an arrow 33, a scanning type exposure apparatus capable of enlarging the exposure area in a certain direction has been developed, so that semiconductor devices of the class of 256M- and 1 G-bit DRAMs can be manufactured. In this case, since the lens aperture (equal to the length of the exposure surface 32) required can be reduced and since the area in the vicinity of the center of the lens 31' is used, more advantages can be obtained for an optical system than in the case of conventional-transfer.

As for scanning methods, there are two methods one being a method of relatively scanning a mask and a wafer, with an optical system fixed and the other being a method of relatively scanning an optical system and a wafer, with a mask fixed. In any of the methods, the mask or optical system and the wafer must be driven with accurate synchronization, in comparison with a conventional exposure apparatus in which an wafer is relatively stepped and repeated. Therefore, control of mask stages and wafer stages is complicated.

However, in an exposure apparatus intended for manufacture of semiconductor devices in the class of 256M and 1 G-bit DRAMs as described above, since the illumination system, the lens system, the driving system, and the control system of the apparatus have special functions different from those of a conventional apparatus, the apparatus is very expensive. Further, since improvements in precision of patterns such as linearity and uniformity of patterns are required for a mask used for an exposure apparatus having a resolution equal to or less than the exposure wavelength, a mask itself has come to be expensive.

It has thus been recognized that increases in costs cannot be avoided for the purpose of manufacturing the newest semiconductor devices. Therefore, from the view point of COO (Cost Of Ownership), it is indispensable to introduce optimization of the entire production system for manufacturing semiconductor devices, in order to reduce costs of the entire system.

This is, for example, a way of thinking called Mix and Match of using different exposure apparatuses mixed and matched for purposes, e.g., a newest scanning type exposure apparatus is used, with respect to exposure of layers requiring a high resolution, while a conventional apparatus is applied to exposure of layers which do not much require a high resolution. However, from the view point of COO as described above, in case where consideration is additionally taken into the designed area of a clean room and throughputs of individual apparatuses, it has been taught that use of a newest apparatus having a small design area and a high throughput results in more advantages even in view of cost performance than use of a conventional apparatus having a large design area and a low throughput, in order to reduce the price of a semiconductor device.

By further developing the way of thinking of Mix and Match from the above point of view, a lower-reducing exposure apparatus has appeared which has a high throughput and which is based on a thought of performing exposure with a reduced reducing with respect to exposure of layers which do not require a high resolution. In this case, even a ½-reducing exposure apparatus having a reducing two times lower than the reducing of ¼ enables transfer of information which is four times more than information that can be transferred by an apparatus of main current trend, onto a pattern 35 which is drawn on the same area on a mask 34 as in case of transfer, as shown in FIG. 1C. Therefore, the throughput can be greatly improved.

As another method of improving the throughput of the entire exposure apparatus, a method of enlarging the mask size has been discussed. As for the method of enlarging the mask size, it is considered that the enlarged size of a substrate and an increase in mask price caused by new developments in a processing apparatus, caused by the enlarged size of a substrate, will lead to an increase in price of a semiconductor device. On the other side, it is also considered that costs will be reduced down as a whole if the production ability is improved.

If the mask size is changed to a size equivalent to a 7-, 8-, or 9-inch square which is larger than a substrate of 6-inch square as a main trend in the class of 64M-bit DRAMs, the information amount which can be transferred by one time of exposure is naturally increased, so that improvements in throughputs can be expected. The following Table 3 show how many patterns can be obtained in case where an alignment mark 43 of an exposure apparatus and a margin for a pellicle protect region 41 for protecting a pattern surface 42 are obtained in an area of width 15 mm in a mask 40 and where regions required for a 1 G- or 4 G-bit DRAM are spread on each exposure region, as shown in FIG. 2.

TABLE 3

Pattern Regions Obtained Per Mask of DRAMs

| DRAM | 64 M | 256 M First Generation | 256 M Second Generation | 256 M Third Generation | 256 M Fourth Generation | 1 G First Generation | 1 G Second Generation |
|---|---|---|---|---|---|---|---|
| REGION SIZE (mm × mm) | 7 × 13 | 13 × 25 | 11 × 22 | 10 × 19 | 8 × 17 | 15 × 31 | 14 × 25 |
| Exposure Region | | 25 mm × Scanning Length | | | | 30 mm × Scanning Length | |
| 6-inch Square | 6 | 2 | 2 | 3 | 3 | 2 | 2 |
| 7-inch Square | 9 | 3 | 3 | 4 | 4 | 2 | 2 |
| 8-inch Square | 9 | 3 | 4 | 4 | 5 | 2 | 3 |
| 9-inch Square | 9 | 3 | 4 | 5 | 6 | 3 | 4 |

| DRAM | 1G Third Generation | 1G Fourth Generation | 4G First Generation | 4G Second Generation | 4G Third Generation | 4G Fourth Generation |
|---|---|---|---|---|---|---|
| REGION SIZE (mm × mm) | 12 × 23 | 10 × 20 | 19 × 38 | 17 × 33 | 14 × 29 | 12 × 25 |
| Exposure Region | 30 mm × Scanning Length | | 35 mm × Scanning Length | | | |
| 6-inch Square | 2 | | | | | |
| 7-inch Square | 3 | 3 | 1 | 2 | 2 | 3 |
| 8-inch Square | 4 | 6 | 2 | 2 | 3 | 3 |
| 9-inch Square | 4 | 6 | 2 | 3 | 3 | 6 |

From simple comparison between areas, by adopting a mask of 9-inch square, it is possible to prospect an exposure region which is, at highest, two times larger than that of a conventional 6-inch square mask of main trend by exposure of one time. In Table 3, a chip of the first generation is a chip under development or of prototype, chips of the second and third generations are chips manufactured on a line developed for manufacturing chips of the generations, and a chip of the fourth generation is manufactured by a lithography technique of a next generation so that chips of the fourth generation can be manufactured with the highest efficiency.

The following Table 4 shows a case of a LOGIC. Since a pattern region required is a square and since a larger region is required than a DRAM, the number of pattern regions which can be maintained is small on a mask. However, it is considered that the exposure region which can be maintained is, at most, two times larger by adopting a mask of 9-inch square like in the case of a DRAM.

TABLE 4

Pattern Regions Maintained Per Mask for LOGIC

| LOGIC | 256 M | 1 G | 4 G |
|---|---|---|---|
| Region Size (mm × mm) | 19 × 19 | 21 × 21 | 23 × 23 |
| Exposure Region | 25 mm × Scanning Length | 30 mm × Scanning Length | 35 mm × Scanning Length |
| 6-inch Square | 1 | 1 | — |
| 7-inch Square | 1 | 1 | 1 |

TABLE 4-continued

Pattern Regions Maintained Per Mask for LOGIC

| 8-inch Square | 2 | 2 | 1 |
|---|---|---|---|
| 9-inch Square | 2 | 2 | 2 |

Meanwhile, the price of an exposure apparatus is expected to increase since a lens having less distortion and a large aperture and an illumination system with a high efficiency are required as the resolution and the region which can be exposed are increased from 256M-bit to 4 G-bit DRAMs. Further, as for the price of the mask like the price of the exposure apparatus, it is necessary to consider developments in a Cr-deposition apparatus for forming a Cr-film and a coater for uniformly applying resist, in addition to an increase in price of blanks themselves.

Supposing a scanning type exposure apparatus of a type in which a mask and a wafer are scanned simultaneously when fixing an optical system, throughputs are calculated in case where masks of 6-inch, 7-inch, 8-inch and 9-inch are used. The calculation results in case of DRAMs are shown in the following Table 5 and those in case of LOGICs are shown in the following Table 6. Here, the values are defined as follows. I.e., the wafer size supposed is 12-inch and the field size is calculated, supposing that the exposure dose is 25 mJ/cm$^2$ and the exposure power is 360 mW/cm$^2$ on the basis of the lens aperture supposed for each generation and that the throughput of an exposure apparatus which is capable of exposing a 6-inch square and has a resolution equivalent to a 256M-bit DRAM is the standard.

TABLE 5

Throughputs of DRAMs

| DRAM | 64 M | 256 M | | | | 1 G | |
|---|---|---|---|---|---|---|---|
| | | First Generation | Second Generation | Third Generation | Fourth Generation | First Generation | Second Generation |
| REGION SIZE (mm × mm) | 7 × 13 | 13 × 25 | 11 × 22 | 10 × 19 | 8 × 17 | 15 × 31 | 14 × 25 |
| Exposure Region | 25 mm × Scanning Length | | | | 30 mm × Scanning Length | | |
| 6-inch Square | 1 | 1 | 1 | 1 | 1 | 1 | 1 |
| 7-inch Square | 1.17 | 1.16 | 1.13 | 1.12 | 0.97 | 1.00 | 1.00 |
| 8-inch Square | 1.17 | 1.16 | 1.22 | 1.22 | 1.11 | 1.00 | 1.07 |
| 9-inch Square | 1.17 | 1.16 | 1.22 | 1.19 | 1.34 | 1.21 | 1.23 |

| DRAM | 1 G | | 4 G | | | |
|---|---|---|---|---|---|---|
| | Third Generation | Fourth Generation | First Generation | Second Generation | Third Generation | Fourth Generation |
| REGION SIZE (mm × mm) | 12 × 23 | 10 × 20 | 19 × 38 | 17 × 33 | 14 × 29 | 12 × 25 |
| Exposure Region | 30 mm × Scanning Length | | 35 mm × Scanning Length | | | |
| 6-inch Square | 1 | | | | | |
| 7-inch Square | 1.15 | 1 | 1 | 1 | 1 | 1 |
| 8-inch Square | 1.11 | 1.30 | 1.58 | 1.00 | 1.14 | 1.29 |
| 9-inch Square | 1.27 | 1.30 | 1.58 | 1.06 | 1.14 | 1.58 |

TABLE 6

Throughputs of LOGIC

| LOGIC | 256 M | 1 G | 4 G |
|---|---|---|---|
| Region Size (mm × mm) | 19 × 19 | 21 × 21 | 23 × 23 |
| Exposure Region | 25 mm × Scanning Length | 30 mm × Scanning Length | 35 mm × Scanning Length |
| 6-inch Square | 1 | 1 | — |
| 7-inch Square | 1 | 1 | 1 |
| 8-inch Square | 1.33 | 1.27 | 1 |
| 9-inch Square | 1.33 | 1.27 | 1.16 |

From Tables 5 and 6, throughputs are averagely improved by 1.27 times by using 9-inch square substrates than those with 6-inch square substrates, including a peak in which the throughput obtained by using a substrate of 9-inch square for a 256M-bit DRAM of the fourth generation is maximum in case of DRAMs, and is about 1.34 times more advantageous than that obtained by using a 6-inch square substrate. In case of LOGICs, throughputs are averagely improved by 1.25 times by using 9-inch square substrates than 6-inch square substrates, including a peak in which the throughput obtained by using a substrate of 9-inch square for the generation of 256M-bit is about 1.33 times more advantageous than that obtained by using a 6-inch square substrate.

In addition, supposing that a conventional mask of a 256M-bit DRAM of the first generation is $10,000 and that one mask is consumed per 25,000 wafers in case of DRAMs while one mask is consumed per 2,000 wafers in case of LOGICs, the cost performance of lithography is expressed as a (throughput)×(chips per wafer)/((a cost for an exposure apparatus)+(a cost for a mask)+(a cost for processing)). Values thus obtained are respectively defined, depending on values for the 256M-bit type of the first generation, for each of cases of DRAMs and LOGICs, and are indicated for each of sizes of masks. The following tables 7 and 8 show the results.

TABLE 8-continued

Cost performance of LOGICs

| Exposure Region | 25 mm × Scanning Length | 30 mm × Scanning Length | 35 mm × Scanning Length |
|---|---|---|---|
| 6-inch Square | 1 | 0.72 | — |
| 7-inch Square | 0.85 | 0.64 | 0.41 |
| 8-inch Square | 0.96 | 0.67 | 0.35 |
| 9-inch Square | 0.81 | 0.57 | 0.35 |

Here, from the cost-performance of DRAMs shown in the above Table 7, a large difference cannot be found between the case of a 9-inch square mask achieving a merit from the fourth generation of 256M-bit to the second generation of 1 G-bit and the case of a 8-inch square mask achieving a merit from the third generation of 1 G-bit to the first generation of 4 G-bit, since both cases are 1.07 times more advantageous, when thinking of averages of both cases. In addition, as shown in Table 8, in the case of LOGICs, it can be found that a 6-inch square mask attains the greatest merit for the generations equivalent to 256M-bit and 1 G-bit types, and a 7-inch square mask attains the greatest merit for the generations equivalent to the 4 G-bit type.

TABLE 7

Cost-performance of DRAMs

| DRAM | 64 M | 256 M | | | | 1 G | |
|---|---|---|---|---|---|---|---|
| | | First Generation | Second Generation | Third Generation | Fourth Generation | First Generation | Second Generation |
| REGION SIZE (mm × mm) | 7 × 13 | 13 × 25 | 11 × 22 | 10 × 19 | 8 × 17 | 15 × 31 | 14 × 25 |
| Exposure Region | | 25 mm × Scanning Length | | | | 30 mm × Scanning Length | |
| 6-inch Square | 3.03 | 1 | 1.14 | 1.43 | 1.87 | .64 | 0.76 |
| 7-inch Square | 3.33 | 1.08 | 1.21 | 1.50 | 1.70 | 0.61 | 0.72 |
| 8-inch Square | 3.13 | 1.01 | 1.22 | 1.40 | 1.81 | 0.57 | 0.73 |
| 9-inch Square | 2.92 | 0.95 | 1.14 | 1.39 | 2.05 | 0.65 | 0.79 |

| DRAM | 1 G | | 4 G | | | |
|---|---|---|---|---|---|---|
| | Third Generation | Fourth Generation | First Generation | Second Generation | Third Generation | Fourth Generation |
| REGION SIZE (mm × mm) | 12 × 23 | 10 × 20 | 19 × 38 | 17 × 33 | 14 × 29 | 12 × 25 |
| Exposure Region | 30 mm × Scanning Length | | 35 mm × Scanning Length | | | |
| 6-inch Square | 0.82 | | | | | |
| 7-inch Square | 0.89 | 1.16 | 0.20 | 0.36 | 0.42 | 0.49 |
| 8-inch Square | 0.93 | 1.41 | 0.31 | 0.34 | 0.46 | 0.60 |
| 9-inch Square | 0.87 | 1.33 | 0.29 | 0.35 | 0.44 | 0.70 |

TABLE 8

Cost performance of LOGICs

| LOGIC Region Size (mm × mm) | 256 M 19 × 19 | 1 G 21 × 21 | 4 G 23 × 23 |
|---|---|---|---|

Therefore, from the aspects of costs and merits, it is considered that the most advantageous way is considered to use an exposure apparatus corresponding to a 8-inch square or 9-inch square substrate in case of manufacturing a DRAM and to use an exposure apparatus corresponding to a 6-inch square or 7-inch square substrate in case of manufacturing a LOGIC. However, since the cases where merits are obtained are different between the exposure apparatuses, it is not possible to consistently chose which mask or exposure apparatus should be used.

Since a drawing apparatus, a measurement apparatus, a defect inspection apparatus, or a repair apparatus, as a mask manufacture apparatus, is applicable to several sizes of substrates, it is possible to mix and use 6-inch square substrates, 7-inch square substrates, 8-inch square substrates, and 9-inch square substrate with each other. However, since a mask stage of an exposure apparatus requires an apparatus, such as a vacuum chuck or the like, for fixing a substrate immediately outside an exposure region, the mask stage is not designed so as to apply to a plurality of sizes of substrates. Therefore, discussions have been made as to whether all the production lines should be arranged so as to correspond to 9-inch square substrates with merits maintained for DRAM production and another exposure apparatus for manufacturing LOGICs of different models and of small production should be prepared, or all the exposure apparatus should be arranged so as to correspond to 6-inch square substrates at the sacrifice of merits of manufacturing DRAMs.

Further, based on the current situation, there is a remarkable difference in demands for DRAMs between when the market is active and when the market is inactive. Therefore, the market of the semiconductor industry changes up and down very harshly. In recent days, DRAMs are manufactured at full power when the market is active, and a part of the production system is switched to manufacture of LOGICs whose market is stable, when the market is inactive. In other words, since no factory can operate only for DRAMs, a factory capable of efficiently manufacturing DRAMs and LOGICs together is necessary.

Thus, as for transfer of circuit patterns of semiconductor devices, there are different optimal mask sizes which maximizes the cost-merit, respectively, for types of DRAM and LOGIC and for each of generations, while one pattern transfer apparatus permits its own mask size and therefore adopts only one mask size. In case where one kind of semiconductor devices is to be manufactured, a corresponding pattern transfer apparatus is used. However, in case of manufacturing several types of semiconductor devices, it is not possible to efficiently manufacture all the types of semiconductor devices even if a pattern apparatus of any pattern size is selected.

BRIEF SUMMARY OF THE INVENTION

The present invention has an object of providing a pattern transfer apparatus capable of efficiently manufacturing semiconductor devices, and a management system thereof, which are capable of solving problems from the view point of cost-merits when a 6-inch square mask or a 9-inch square mask is used or when using 6-inch and 9-inch square masks mixed together.

In order to solve the above problems, a pattern transfer apparatus according to the present invention comprises: a first substrate on which a circuit pattern of an arbitrary semiconductor device is drawn; a first stage including a substrate holding mechanism for holding the first substrate; an illumination optical system for illuminating the circuit pattern of the semiconductor device drawn on the first substrate; a second stage on which a second substrate can be mounted; a reducing optical system or an equimultiple optical system for transferring a part of the circuit pattern of the semiconductor device drawn on the first substrate; and means for moving first through third elements, in which a first element is the first stage, a second element is the second stage, and a third element is the reducing optical system or an equimultiple optical system, wherein the first stage has a holding mechanism including means for holding one of substrates of at least two sizes and for changing a gripping force in accordance with the sizes of the substrates.

The followings are preferred manners of the above pattern transfer apparatus.

(1) The pattern transfer apparatus further comprises: a substrate container mechanism for containing the first substrate; and substrate transport means for transporting the first substrate to mount the first substrate on the first stage or to store the first substrate in the substrate container mechanism, wherein the substrate container mechanism has a mechanism for containing one of substrates of at least two sizes, and one of the substrate container mechanism and the substrate transport mechanism includes substrate size identifying means for identifying a size of the first substrate.

(2) In the pattern transfer apparatus, the substrate holding mechanism includes gripping force select means for selectively changing a gripping force for holding the first substrate in accordance with the size of the first substrate identified by the substrate size identify means.

(3) The pattern transfer apparatus further comprises: a substrate container mechanism for containing the first substrate; substrate transport means for transporting the first substrate to mount the first substrate on the first stage or to store the first substrate in the substrate container mechanism; communication means for externally inputting information including pattern data, an identification mark, a size, a thickness; and control means for selecting the gripping force select means, the substrate transport means, and the substrate container mechanism, based on the information obtained by the communication means. A pattern transfer apparatus management system includes a plurality of above-mentioned pattern transfer apparatuses each further comprising an exposure control system for controlling the first stage, the substrate transport means, the substrate container mechanism, the illumination optical system, the second stage, and the reducing optical system, and the transfer management system comprises transmit means for sending an instruction for selecting the size of the first substrate for each of the plurality of pattern transfer apparatuses and for controlling the pattern transfer apparatuses in correspondence with the size of the first substrate selected, to the exposure control means of the pattern transfer apparatuses.

(4) In each of the above pattern transfer apparatuses, the gripping force (F) of the substrate holding means is larger than $m(\alpha/\mu-g)$ ($F>m(\alpha/\mu-g)$: g is an acceleration of gravity), where a mass of the first substrate is m, an acceleration of the first substrate during moving the substrate is $\alpha$, and a coefficient of static friction between the first substrate and the substrate holding means is $\mu$.

Further, an operation management system for a semiconductor manufacture apparatus, according to the present invention, comprises: at least one drawing means applicable to at least two substrate sizes, for drawing a circuit pattern of an arbitrary semiconductor device onto a first substrate; at least one evaluation means applicable to at least two substrate sizes, for evaluating the first substrate on which the circuit pattern of the semiconductor device is drawn; at least one repair means applicable to at least two substrate sizes, for repairing the first substrate on which the circuit pattern of the semiconductor device is drawn; at least one pattern transfer means applicable to at least two substrate sizes, for transferring the circuit pattern of the semiconductor device drawn on the first substrate, onto the second substrate; and operation management means for monitoring operating states of the drawing means, the evaluation means, the repair means, and the pattern transfer means, and for operating all of the means, wherein the operation management means includes means for selecting and operating a part or all of the drawing means, the evaluation means, the repair means, and the pattern transfer means, in correspondence with a size of the first substrate, changed in accordance with a type of the circuit pattern of a semiconductor device to be manufactured.

Another operation management system for a semiconductor manufacture apparatus, according to the present invention, comprises: a plurality of drawing means prepared so as to be applicable to at least two substrate sizes and each used for drawing a circuit pattern of an arbitrary semiconductor device onto a first substrate; a plurality of evaluation means prepared so as to be applicable to at least two substrate sizes and each used for evaluating the first substrate on which the circuit pattern of the semiconductor device is drawn; a plurality of repair means prepared so as to applicable to at least two substrate sizes and each used for repair the first substrate on which the circuit pattern of the semiconductor device is drawn; a plurality of pattern transfer means prepared so as to be applicable to at least two substrate sizes and each used for transferring the circuit pattern of the semiconductor device drawn on the first substrate, onto the second substrate; and operation management means for monitoring operating states of the drawing means, the evaluation means, the repair means, and the pattern transfer means, and for operating all of the means, wherein the operation management means includes means for selecting and operating a part or all of the drawing means, the evaluation means, the repair means, and the pattern transfer means, in correspondence with a size of the first substrate, changed in accordance with a type of the circuit pattern of a semiconductor device to be manufactured.

According to the present invention, masks of different sizes can be selectively held on the first stage. For example, it is possible to select mask sizes in accordance with applications and purposes, even with one same pattern transfer apparatus, by providing a mask holding mechanism. Further, since the mask transport mechanism and the mask container mechanism are constructed so as to comply with masks of different sizes, masks of different sizes can be easily replaced with each other. Therefore, the productivity can be improved in both cases of manufacturing DRAMs and LOGICs.

Although a mask must be fixed to the first stage with a sufficient gripping force, there are cases in which the mask is bent and an excellent pattern cannot be transferred because a gripping force greater than required is applied. In contrast, according to the present invention, the gripping force can be changed in accordance with the size and the thickness of a mask, so that different masks can respectively fixed with optimal gripping forces. As a result, excellent pattern transfer can always be achieved.

As has been explained above, according to the present invention, since a mask holding mechanism is used for selectively holding masks of different sizes on the first stage where a mask is held, masks of different sizes can be chosen in accordance with manufacturing costs for semiconductor devices. As a result of this, pattern transfer can be performed with the mask size from which the greatest merits of costs can be expected, so that semiconductor devices can be manufactured efficiently.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 10A and 10B are a plan view and a side view, respectively, which show the structure of a mask stage used in a second embodiment;

DETAILED DESCRIPTION OF THE INVENTION

In the following, details of the present invention will be explained with reference to embodiments shown in the figures.

(First Embodiment)

Figure 1A:
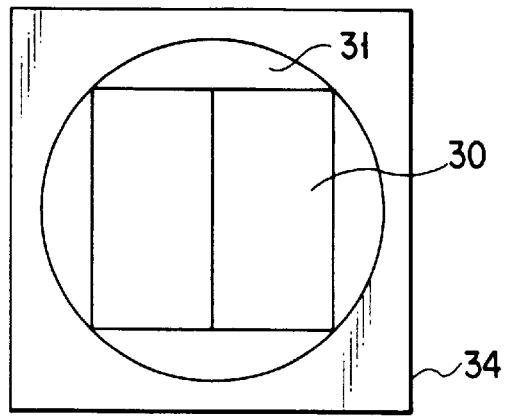
FIGS. 1A to 1C explain problems of the prior art and are views schematically showing the relationship between a pattern region and a lens.
Figure 1B:
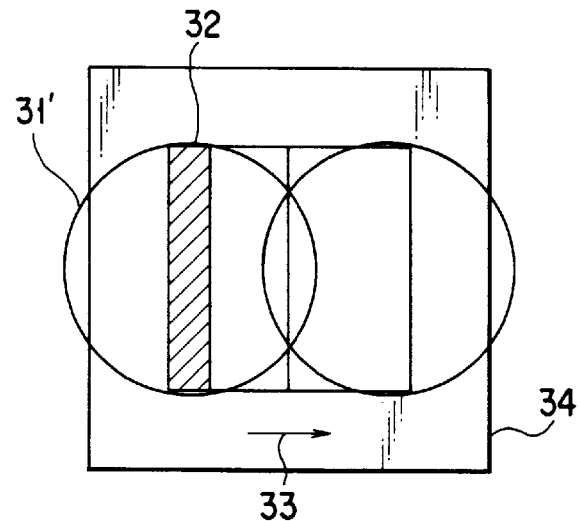
Figure 1C:
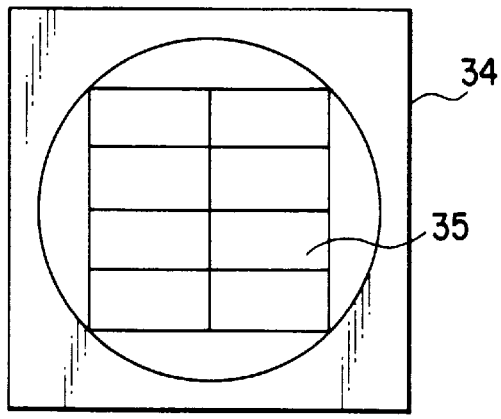
Figure 2:
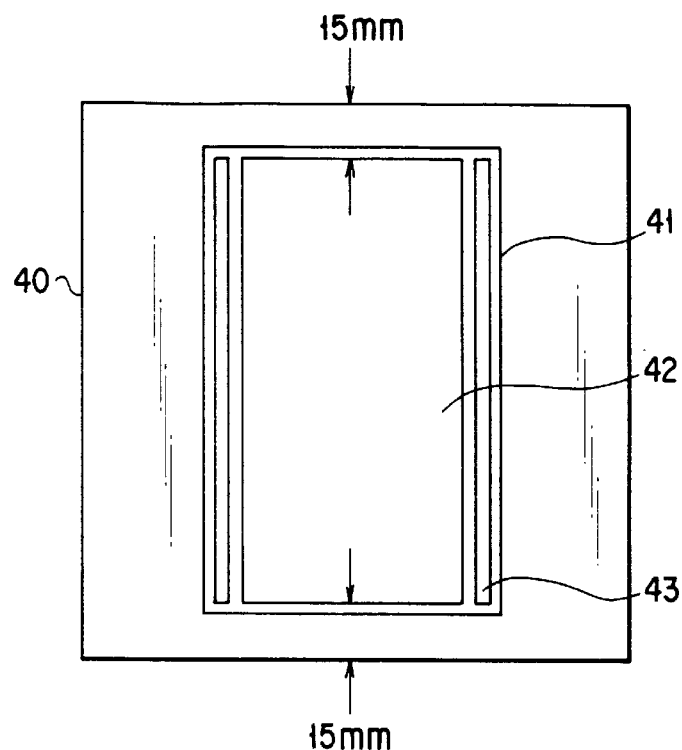
FIG. 2 is a plan view showing an example of an exposure region on a mask and mask holding regions.
Figure 3:
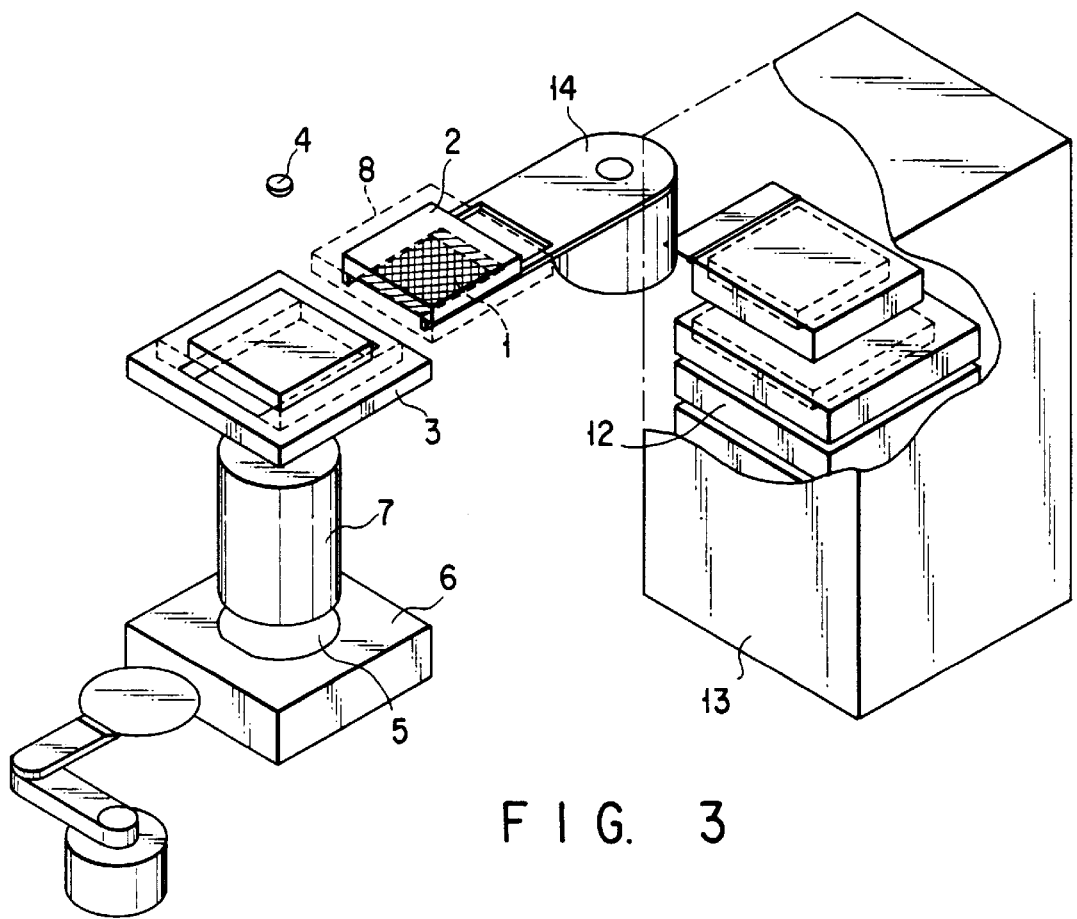
FIG. 3 is a view schematically showing the structure of a pattern transfer apparatus according to a first embodiment of the present invention.

FIG. 3 is a view schematically showing the structure of a pattern transfer apparatus according to a first embodiment of the present invention. This apparatus basically comprises a mask stage (first stage) on which a circuit pattern 1 of a semiconductor circuit is drawn and by which scanning can be performed in one direction with a mask 2 (or 8) mounted thereon, an illumination optical system 4 for illuminating a pattern region 1 of the mask 2 (or 8), a wafer stage (or second stage) 6 which is capable of running freely in X- and Y-directions with a wafer (or a substrate to be processed) 5, and a reducing projection optical system 7 for projecting the pattern 1 drawn on the mask 2 (or 8), onto the wafer 5, at a reducing ratio of 1/5 or 1/4.

A means for fixing the mask 2 (or 8) to the mask stage 3 may be a vacuum chuck, a clamp mechanism, or the like which is capable of mechanically fixing and releasing the mask.

In the present embodiment, a mask holding mechanism which is capable of holding even masks of different sizes is adopted for a 6-inch square mask and a 9-inch square mask 8. Practical examples of the mask holding mechanism are shown in FIGS. 4A and 4B.

Figure 4A:
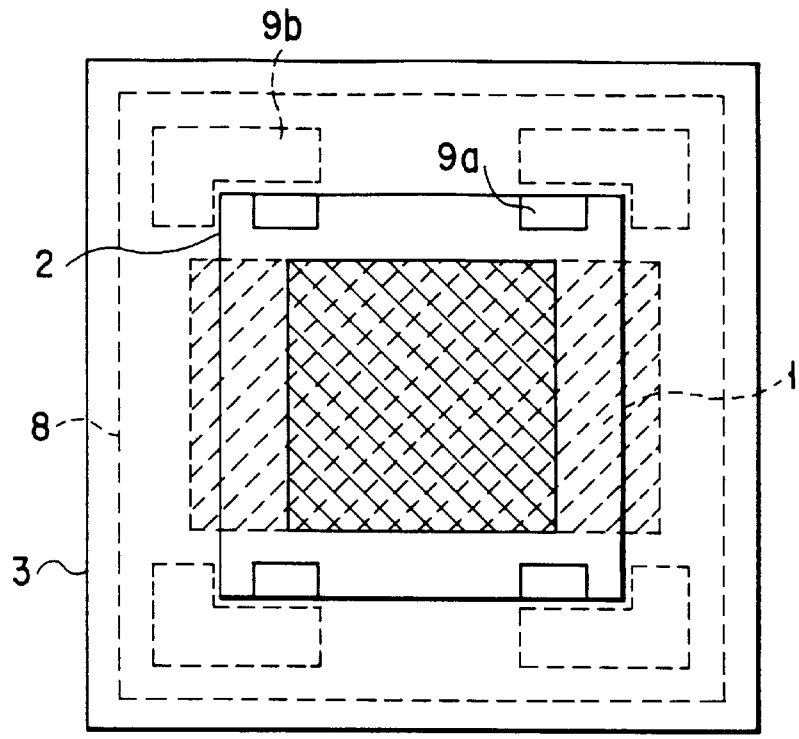
FIGS. 4A and 4B are plan views showing examples of mask stages used in the first embodiment.

FIG. 4A shows a mask holding mechanism capable of corresponding to a pattern region 1 extended only in the scanning direction, in a pattern transfer apparatus of scanning type. The vacuum chuck portion 9a for a 6-inch square mask 2 is commonly used as a vacuum chuck for a 9-inch mask 8. In this case, the vacuum chuck portion 9a for the 6-inch square mask 2 and the vacuum chuck portion 9b for the 9-inch square mask 8 may be provided at different positions, respectively.

Figure 4B:
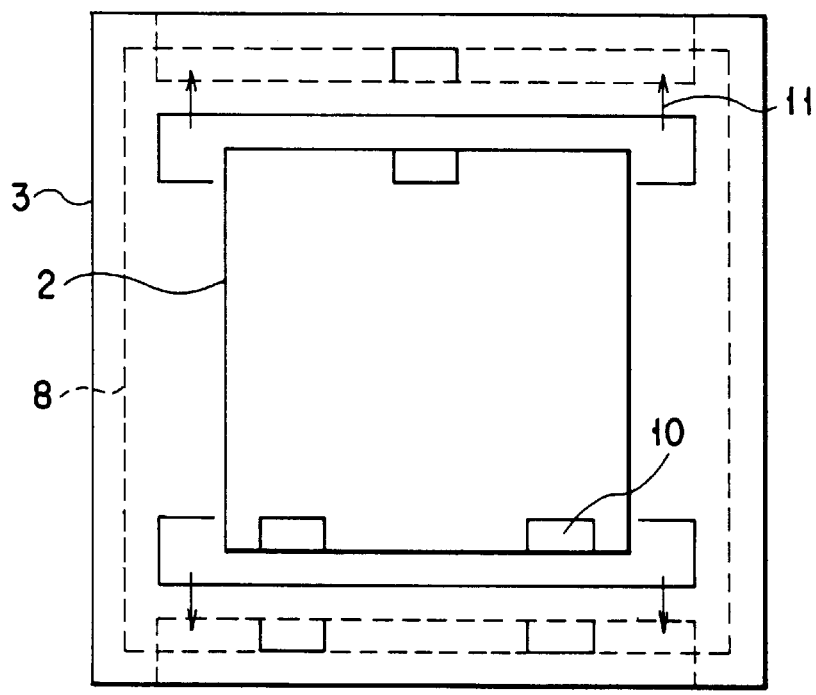

FIG. 4B shows a mask holding mechanism capable of corresponding to a pattern region 1 extended in a direction other than the scanning direction, and a part or all of the vacuum chuck portions 10 for fixing a mask can be moved as indicated by an arrow 11 in FIG. 4B.

Although not shown, there are other methods than those shown in FIGS. 4A and 4B, e.g., a method of fixing a mask by a tool for absorbing a change amount even when the mask size changes.

Figure 5:
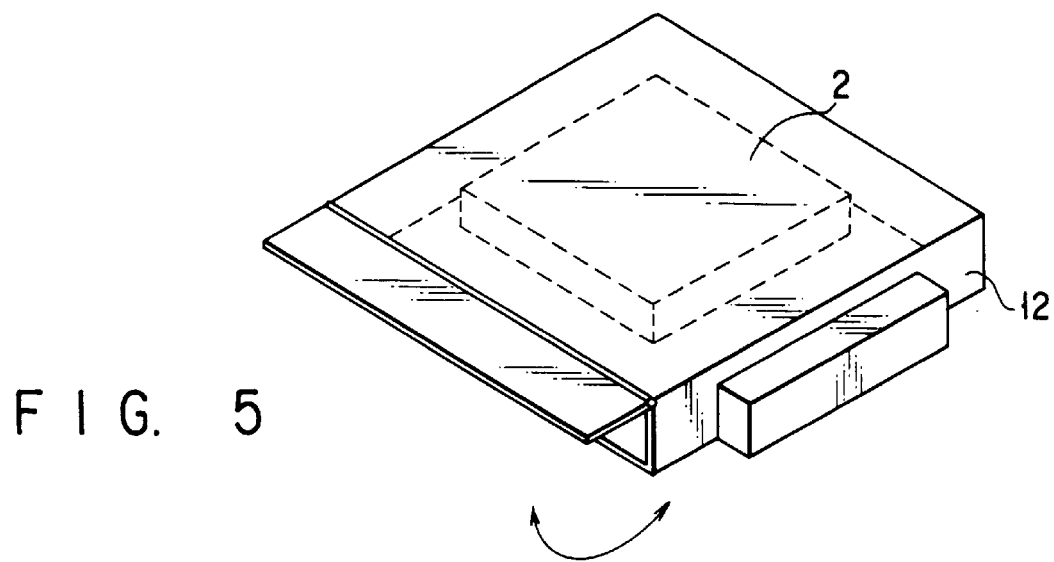
FIG. 5 is a perspective view showing an example of a cassette used in the first embodiment.
Figure 6:
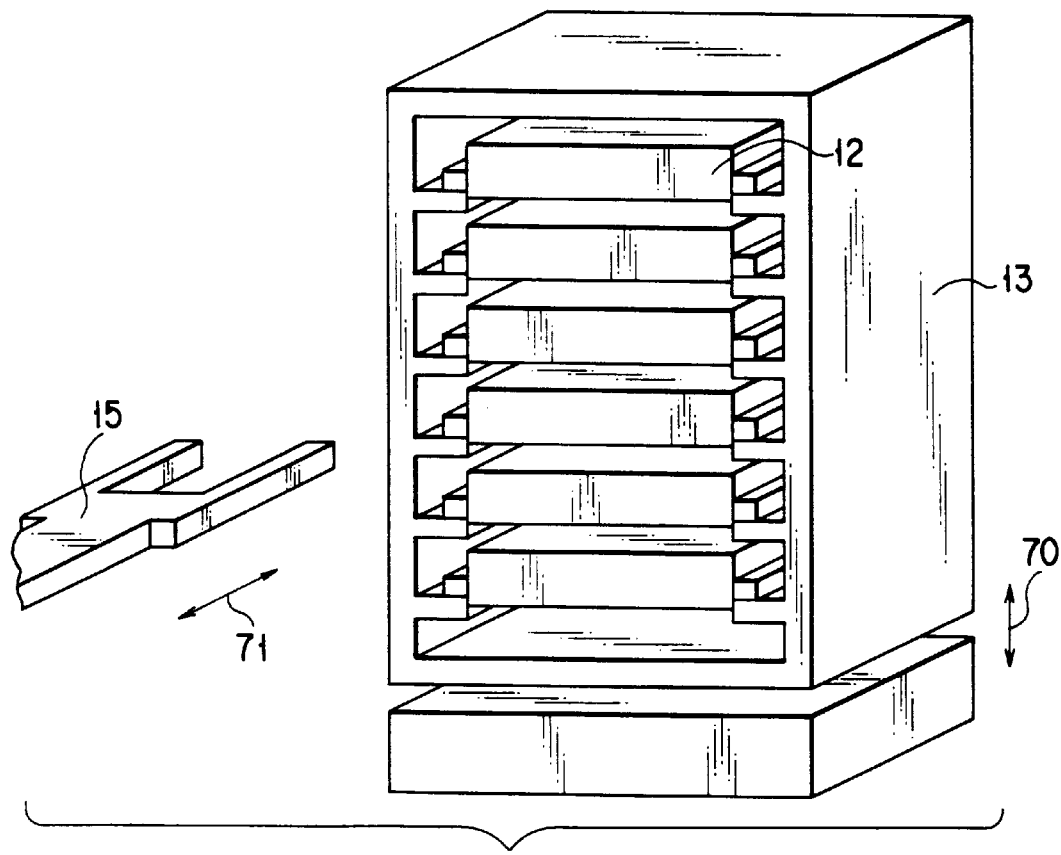
FIG. 6 is a perspective view showing an example of a cassette container mechanism used in the first embodiment.

The mask 2 is contained in a mask cassette 12 (which will be named a "cassette" hereinafter) which locally ensures cleanness so that dust or the like might not stick to the pattern surface. As shown in FIG. 5, the cassette 12 comprises a box which has a size larger than the mask 2, and a door is provided in one side of the box. The cassette 12 is contained in a cassette container mechanism (or mask container mechanism) 13 capable of containing a plurality of cassettes 12. The cassette container mechanism 13 is capable of transporting in and out masks by a hand 15 which enters in from the direction indicated by an arrow 71 as the cassette 12 moves up and down in the direction of an arrow 70. Note that the cassette container mechanism 13 comprises a mechanism for opening and closing the cassette 12 when the cassette 12 reaches a predetermined height although it is not shown in figures.

Figure 7:
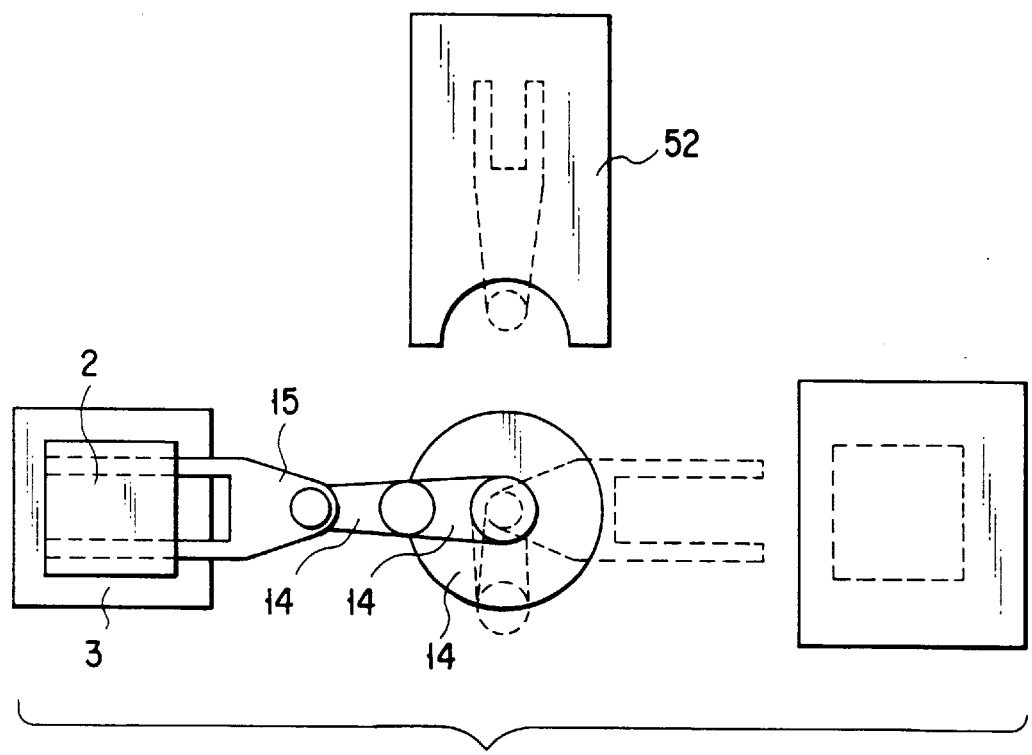
FIG. 7 is a plan view showing an example of a mask transport mechanism used in the first embodiment.

In addition, since it is necessary to transport a mask between the cassette container mechanism 13 and the mask stage 3, a mask transport mechanism is provided in the present embodiment. This mask transport mechanism 14 is constructed by arranging the hand 15 so as to be moved via two connection arms 14a and 14b, as shown in FIG. 7. Further, the mask transport mechanism 14 picks up a mask from a desired cassette 12 contained in the cassette container mechanism 13 and transports the mask onto the mask stage 3, or the mask transport mechanism 14 transports a mask from the mask stage 3 and stores it into the cassette 12.

The cassette 12 for containing a mask may adopt a method in which the position of a mask support portion in the cassette is arranged for each of sizes of masks when the size of a mask is changed, for example, from a 6-inch square mask 2 to a 9-inch square mask, or a method of containing a mask by a tool which absorbs a change amount when the size of a mask is changed.

Figure 8:
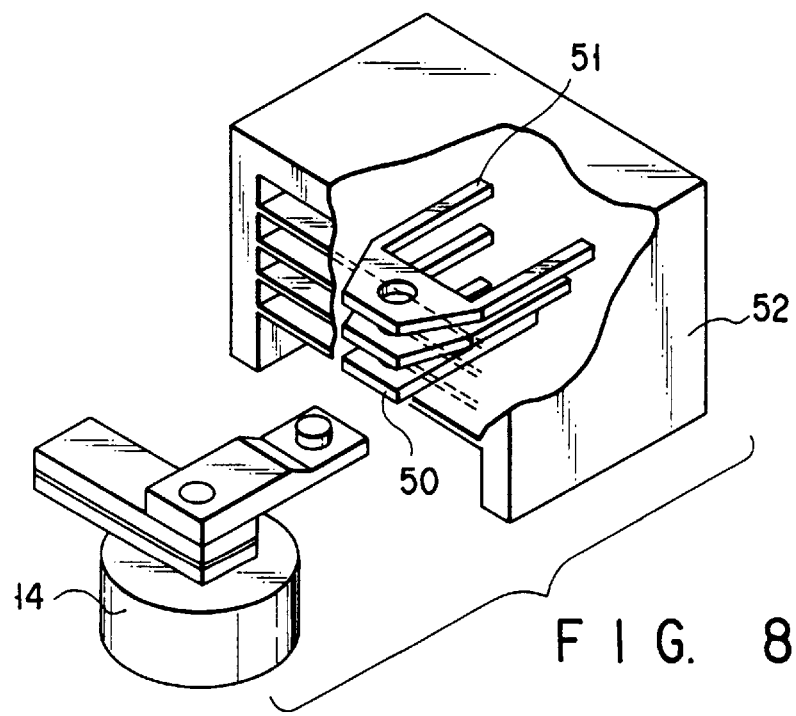
FIG. 8 is a perspective view showing an example of a hand structure of a mask transport mechanism used in the first embodiment.

In addition, the mask transport mechanism 14 for transporting the masks 2 and 8 having different sizes onto the mask stage 3 from the cassette 12 or from the mask stage 3 to the cassette 12 has a structure in which a 6-inch square hand 50 and a 9-inch square hand 51 can be replaced with each other and can be taken out from a hand stocker 52, in correspondence with the size of a mask, for example, as shown in FIG. 8.

Figure 9A:
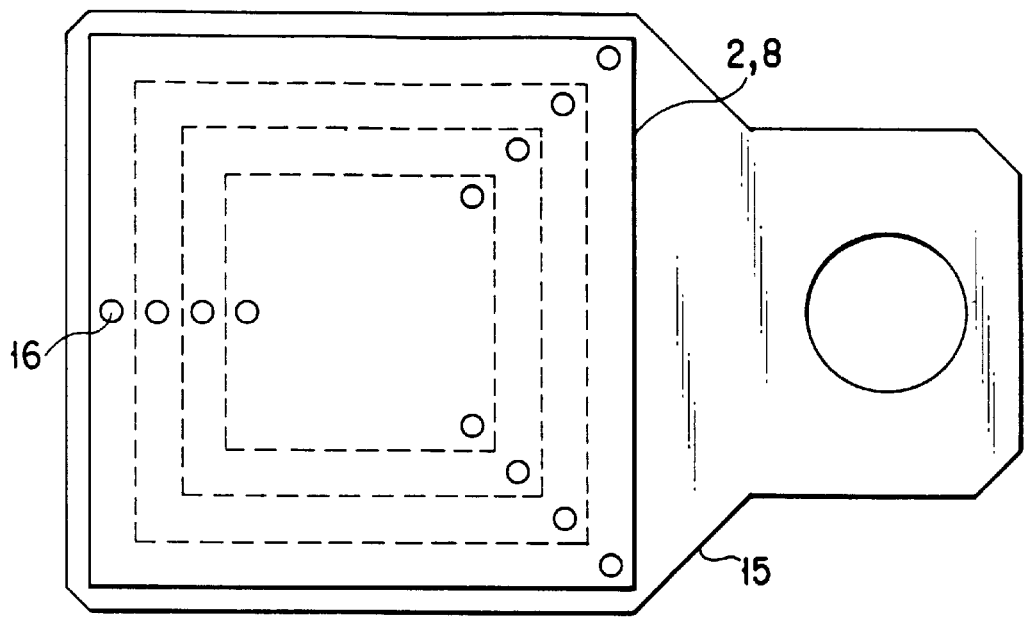
FIGS. 9A and 9B are plan views showing examples of a hand structure of a mask transport mechanism used in the first embodiment.
Figure 9B:
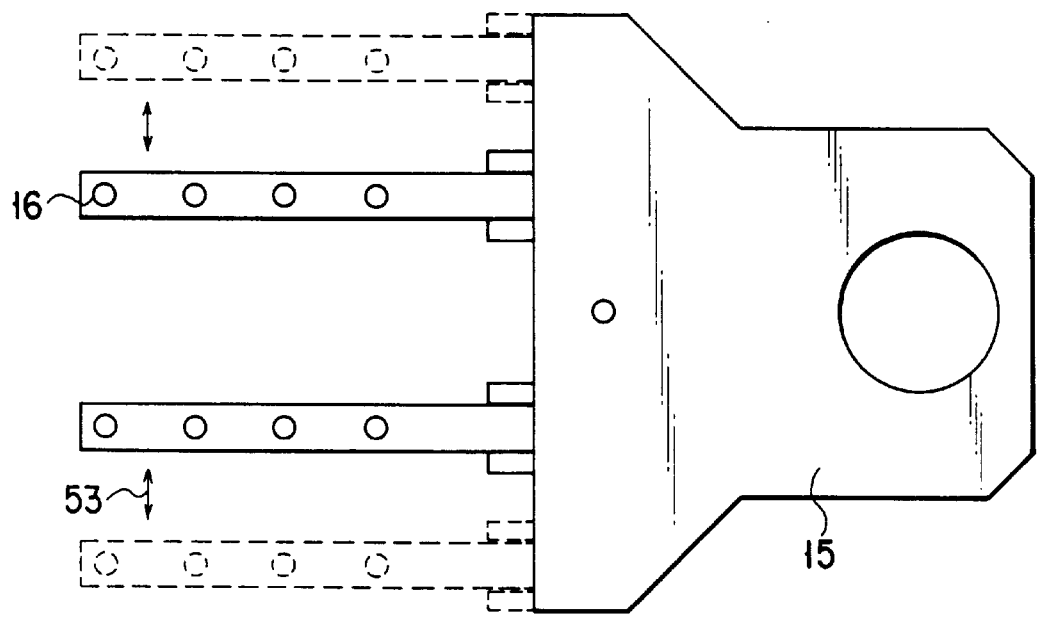

Further, in place of replacing the hands, one hand may be arranged so as to correspond to a plurality of sizes of masks. For example, as shown in FIG. 9A, a hand 15 provided for the mask transport mechanism 14 may be arranged such that the portion which has a contact with masks 2 and 8 is changed in accordance with the sizes of masks and such that support portions 16 are arranged on steps. In addition, as shown in FIG. 9B, it is possible to adopt a structure in which the positions of support portions 16 can be moved in the direction indicated by an arrow 53, in accordance with the sizes of masks.

In the structures as described above, since a plurality of masks 2 and 8 of different sizes respectively contained in cassettes 12 are stocked in the cassette container mechanism 13, pattern transfer can be performed by selecting a optimum mask size in correspondence with a semiconductor device to be manufactured. Specifically, it is possible to select a mask size which is expected to attain the greatest cost-merit with respect to a circuit pattern of a semiconductor device to be transferred, so that the pattern can be transferred with the highest efficiency. Therefore, it is possible to improve the productivity in both cases of manufacturing DRAMs and LOGICs.

(Second Embodiment)

In the following, explanation will be made to a pattern transfer apparatus according to a second embodiment of the present invention. Note that the basic structure of the pattern transfer apparatus is the same as that shown in FIG. 3 and its description will therefore be omitted herefrom. This second embodiment is different from the first embodiment in the structure of the mask holding mechanism.

As has been explained before, a mask holding mechanism for fixing a mask to a mask stage 3 may be a vacuum chuck or a clamp mechanism or the like capable of mechanically fixing and releasing a mask. In the present embodiment, the chuck area of the vacuum chuck or the mechanical clamp force can be selected in accordance with the mask size, so that the mask might not be moved as the mask stage 3 operates even when the size of a mask is changed between a 6-inch square mask 2 and a 9-inch square mask 8.

Specifically, as shown in FIG. 10A, the area of each 9-inch square vacuum chuck portion 63 is formed to be larger in comparison with the area of 6-inch square vacuum chuck portion 62. When holding a 6-inch square mask 2, only 6-inch square mask vacuum chuck portions 62 are used. When holding a 9-inch square mask 8, only 9-inch square vacuum chuck portions 63 are used or 9-inch square vacuum chuck portions 63 and 6-inch square vacuum chuck portions 62 are used together in combination. As a result of this, the vacuum chuck area can be changed in accordance with the sizes of masks, so that an optimal chuck force can be applied in accordance with the sizes of masks.

Further, in case of a clamp mechanism for clamping masks 2 and 8 as shown in FIG. 10B, clamps 66 are moved in directions (toward the inside of the mask) indicated by arrows 64, in accordance with the sizes of masks, thereby to variably control the clamp force. This clamp force is adjusted to a predetermined force corresponding to the size of a mask, in accordance with instructions from a load sensor (not shown) provided at a movable portion of the clamps 66. In this manner, the clamp force can be changed in correspondence with the mask size, so that an optimal clamp force corresponding to a mask size can be applied.

(Third Embodiment)

In the following, a pattern transfer apparatus according to the third embodiment of the present invention will be explained below. Note that the basic structure of the pattern transfer apparatus is the same as that shown in FIG. 3 and its description will therefore be omitted herefrom.

Figure 11:
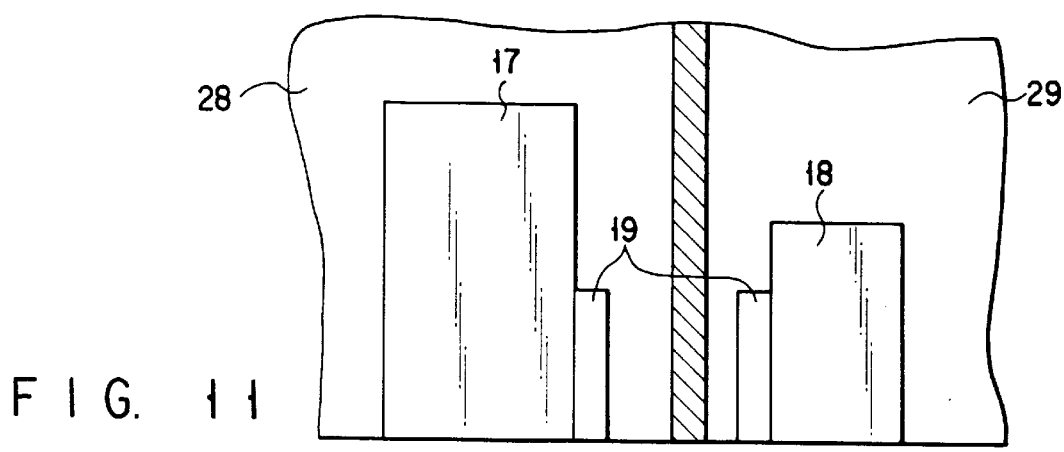
FIG. 11 shows a view schematically showing a relationship between a pattern transfer apparatus and a terminal in a third embodiment.

In this third embodiment, as shown in FIG. 11, a mask to be used next is remotely instructed from a place which is spatially distant from the place where a pattern transfer apparatus 17 is placed. For example, an external terminal 18 and a communication means 19 thereof are provided such that a pattern transfer apparatus 17 settled in a room 28 kept in high cleanliness (inside a clean room) can be controlled from a place 29 kept in low cleanliness (outside the clean room).

The structures of a mask stage 3 for holding masks 2 and 8 of different sizes, a cassette 12, a cassette container mechanism 13 for containing a plurality of cassette 12, and a mask transport mechanism 14 may be arranged in the same manner as shown in the first or second embodiment.

In this third embodiment, when a mask of an arbitrary size intended to be subject to pattern transfer is selected among masks contained in a cassette container mechanism 13, from an external terminal 18 by a communication means 19, a hand 15 of a mask transport mechanism 14, support portions of a mask stage 3, and a gripping force are selected in compliance with a selected desired mask size, so that a pattern 1 of a semiconductor device drawn on a mask 2 or 8 of the desired mask size can be transferred.

(Fourth Embodiment)

Figure 12:
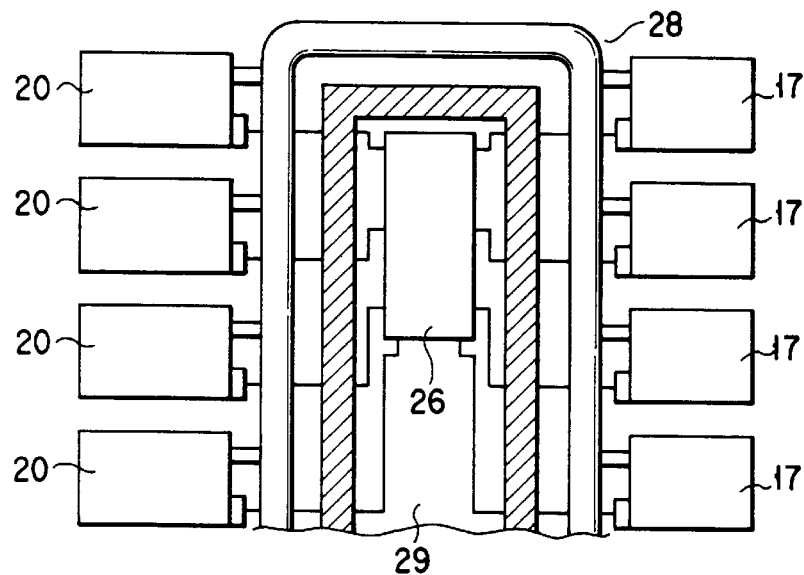
FIG. 12 shows a system configuration of a management system of a pattern transfer apparatus according to a fourth embodiment.

FIG. 12 shows a system configuration of a management system for a pattern transfer apparatus, according to a fourth embodiment of the present invention. This system is constructed by comprising one or a plurality of pattern transfer apparatuses 17 as shown in FIG. 3, one or a plurality of pattern transfer apparatuses 20 applicable to one fixed mask size, and a pattern transfer management section 26 for totally managing the apparatuses 17 and 20.

Note that a communication means 19 as shown in FIG. 11 may be provided in case where pattern transfer apparatuses 17 and 20 are settled in a room kept at a cleanliness different from that of a room where the management section 26 is settled.

As shown in FIG. 12, according to this fourth embodiment, when DRAMs are to be manufactured at the full operation speed, all the pattern transfer apparatuses can be used as apparatuses for 9-inch square masks and merits of throughputs obtained by enlarging the mask diameter can be achieved to a maximum, by preparing at least one pattern transfer apparatus 17, and by managing any other pattern transfer apparatuses 20 as conventional apparatuses for a fixed mask size and especially as apparatuses for 9-inch square masks according to a target of DRAMs which must constantly be manufactured, under control of the pattern transfer management section 26.

In addition, in case of treating a special mask or LOGICs, semiconductor devices can be manufactured without decreasing the merits of throughputs if the pattern transfer apparatus 17 as explained above is used as an apparatus for a 6-inch square mask by supplying an instruction from the pattern transfer management section 26.

(Fifth Embodiment)

Figure 13:
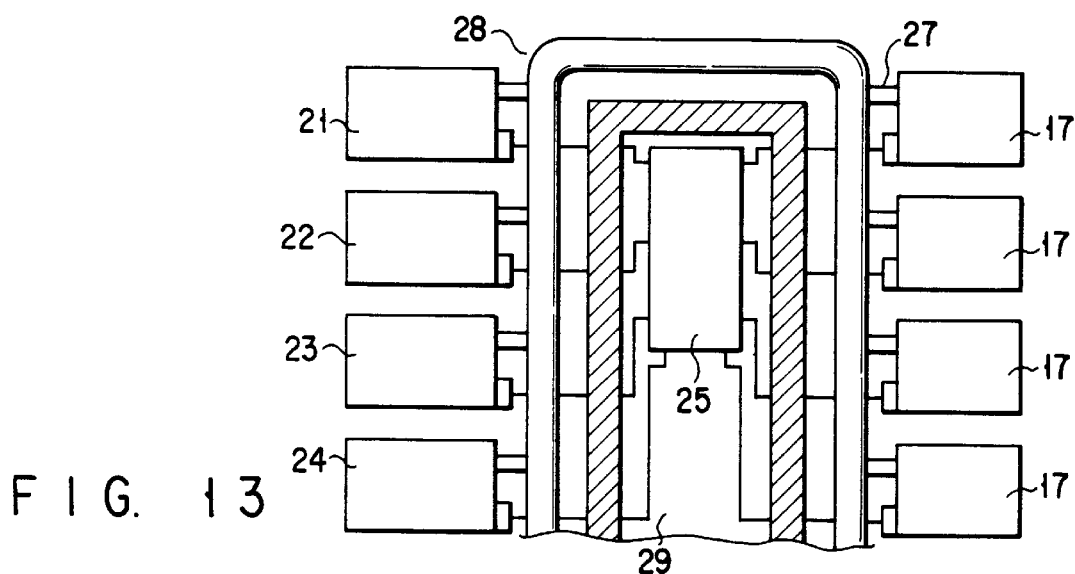
FIG. 13 shows a system configuration of a production management system of a semiconductor manufacture apparatus according to a fifth embodiment.

FIG. 13 is a system configuration showing a production management system for semiconductor devices, according to a fifth embodiment of the present invention.

In this fifth embodiment, a mask drawing apparatus 21, a mask size measure apparatus 22, a defect inspection apparatus 23, a defect repair apparatus 24, and at least one pattern transfer apparatus 17 are connected to each other through non-dust mask transport paths 27, respectively. The mask drawing apparatus 21 is capable of drawing a pattern, for example, for a 6-inch square mask and a 9-inch square mask. The mask size measure apparatus 22 is capable of evaluating the coordinate precision and the linearity of line widths of patterns drawn on 6-inch square masks and 9-inch square masks. The defect inspection apparatus 23 serves to measure and evaluate presence or absence of a defect in the patterns drawn on the 6-inch and 9-inch square masks and the size and type of the defect if any. The defect repair apparatus 24 serves to make repair, by sputtering or patching a defective portion of the patterns drawn on the 6-inch and 9-inch square masks, detected by the defective inspection apparatus or the like. The pattern transfer apparatus 17 is capable of transferring the patterns drawn on the 6-inch and 9-inch square masks. These apparatuses are settled in the situation of a clean room.

Outside the clean room, there is provided a production management section 25 for semiconductor devices, which is capable of monitoring the operating states of the drawing apparatus 21, the mask size measure apparatus 22, the defect inspection apparatus 23, the defect repair apparatus 24, the pattern transfer apparatus 17, and a non-dust mask transport cart not shown which passes through the non-dust mask transport paths 27. The section 25 is also capable of arbitrarily operating the apparatuses and the cart.

Note that this fifth embodiment may be provided with a communication means 19 as shown in FIG. 11 explained before, in order to remotely control the drawing apparatus 21, the mask size measure apparatus 22, the defect inspection apparatus 23, the defect repair apparatus 24, the pattern transfer apparatus 17, the non-dust mask transport cart passing through the non-dust mask transport paths 27, and the like.

In the present embodiment, when DRAMs are manufactured at the full operation speed, merits of throughputs obtained by enlarging the mask size can be achieved to a maximum if all the apparatuses starting including the drawing apparatus 21 and so on are operated as apparatus for 9-inch square masks by supplying an instruction from the production management section 25.

In case of treating a special mask and LOGICS, manufacture is carried out without reducing merits of throughputs if drawing and repair are carried out by supplying an instruction from the production management section 25 to select a 6-inch or 7-inch square mask which effects the greatest merits in the aspects of operation and costs and the pattern transfer apparatus 17 of the present invention as described above is used as an apparatus for a 6-inch square mask by also supplying an instruction from the production management system 25 of the semiconductor manufacture apparatus.

Note that the present invention is not limited to the embodiments described above. An illumination optical system for illuminating masks naturally may be a light source using an i-line or a g-line as described before, or may be a deep ultraviolet light source such as KrF, ArF, or the like which has a shorted wavelength. Further, it is possible to adopt an X-ray exposure apparatus using not light but an X-ray or an exposure apparatus using an electron beam or an ion beam as its exposure source. A projection optical system is not always limited to a reducing optical system, but an equimultiple transfer optical system is applicable.

A mask holding mechanism, a transport mechanism, a container mechanism, and the like are not limited to the methods described in the above embodiments, but can be arbitrarily modified in accordance with specifications. In addition, a substrate to be processed is not always limited to a semiconductor wafer, but an insulating substrate such as a quartz substrate or the like is applicable. The present invention can be variously practiced in form of any other modifications, without deviating from the scope of the present invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

We claim:

1. A pattern transfer apparatus comprising:
   a first substrate on which a circuit pattern of an arbitrary semiconductor device is drawn;
   a first stage including a substrate holding mechanism for holding the first substrate;
   an illumination optical system for illuminating the circuit pattern of the semiconductor device drawn on the first substrate;
   a second stage on which a second substrate can be mounted;
   a reducing optical system or an equimultiple optical system or transferring a part of the circuit pattern of the semiconductor device drawn on the first substrate; and
   means for moving first through third elements, in which a first element is the first stage, a second element is the second stage, and the third element is the reducing optical system or an equimultiple optical system, wherein
      the first stage has a holding mechanism including means for holding one of substrates of at least two sizes and for changing a gripping force in accordance with the sizes of the substrates.

2. A pattern transfer apparatus according to claim 1, wherein the gripping force (F) of the substrate holding means is larger than $m(\alpha/\mu-g)$ ($F>m(\alpha/\mu-g)$ g is an acceleration of gravity), where a mass of the first substrate is m, an acceleration of the first substrate during moving the substrate is $\alpha$, and a coefficient of static friction between the first substrate and the substrate holding means is $\mu$.

3. A pattern transfer apparatus according to claim 1, further comprising:
   a substrate container mechanism for containing the first substrate; and
   substrate transport means for transporting the first substrate to mount the first substrate on the first stage or to store the first substrate in the substrate container mechanism, wherein
      the substrate container mechanism has a mechanism for containing one of substrates of at least two sizes, and one of the substrate container mechanism and the substrate transport mechanism includes substrate size identify means for identifying a size of the first substrate.

4. A pattern transfer apparatus according to claim 3, wherein the gripping force (F) of the substrate holding means is larger than $m(\alpha/\mu-g)$ ($F>m(\alpha/\mu-g)$ g is an acceleration of gravity), where a mass of the first substrate is m, an acceleration of the first substrate during moving the substrate is $\alpha$, and a coefficient of static friction between the first substrate and the substrate holding means is $\mu$.

5. A pattern transfer apparatus according to claim 1, wherein the substrate holding mechanism includes gripping force select means for selectively changing a gripping force for holding the first substrate in accordance with the size of the first substrate identified by a substrate size identify means.

6. A pattern transfer apparatus according to claim 5, wherein the gripping force (F) of the substrate holding means is lager than $m(\alpha/\mu-g)$ ($F>m(\alpha/\mu-g)$ g is an acceleration of gravity), where a mass of the first substrate is m, an acceleration of the first substrate during moving the substrate is $\alpha$, and a coefficient of static friction between the first substrate and the substrate holding means is $\mu$.

7. A pattern transfer apparatus according to claim 1, further comprising:
   a substrate container mechanism for containing the first substrate;
   substrate transport means for transporting the first substrate to mount the first substrate on the first stage or to store the first substrate in the substrate container mechanism;
   communication means for externally inputting information including pattern data, an identification mark, a size, and a thickness; and
   control means for selecting the holding mechanism of the first stage, the substrate transport means, and the substrate container mechanism, based on the information obtained by the communication means.

8. A pattern transfer apparatus according to claim 7, wherein the gripping force (F) of the substrate holding means is larger than $m(\alpha/\mu-g)$ ($F>m(\alpha/\mu-g)$ g is an acceleration of gravity), where a mass of the first substrate is m, an acceleration of the first substrate during moving the substrate is $\alpha$, and a coefficient of static friction between the first substrate and the substrate holding means is $\mu$.

9. A pattern transfer apparatus management system including a plurality of pattern transfer apparatuses each according to claim 7 and further comprising exposure control system for controlling the first stage, the substrate transport means, the substrate container mechanism, the illumination optical system, the second stage, and the reducing optical system, comprising:
   transmit means for sending an instruction for selecting the size of the first substrate for each of the plurality of pattern transfer apparatuses and for controlling the pattern transfer apparatuses in correspondence with the size of the first substrate selected, to the exposure control means of the pattern transfer apparatuses.

10. An operation management system for a semiconductor manufacture apparatus, comprising:
   at least one drawing means applicable to at least two substrate sizes, for drawing a circuit pattern of an arbitrary semiconductor device onto a first substrate;
   at least one evaluation means applicable to at least two substrate sizes, for evaluating the first substrate on which the circuit pattern of the semiconductor device is drawn;
   at least one repair means applicable to at least two substrate sizes, for repairing the first substrate on which the circuit pattern of the semiconductor device is drawn;

at least one pattern transfer means applicable to at least two substrate sizes, for transferring the circuit pattern of the semiconductor device onto a second substrate; and operation management means for monitoring operating states of the drawing means, the evaluation means, the repair means, and the pattern transfer means, and for operating all of the means, wherein the operation management means includes means for changing a size of the first substrate in accordance with a type of the circuit pattern of a semiconductor device to be manufactured, and means for selecting and operating a part or all of the drawing means, the evaluation means, the repair means, and the pattern transfer means in correspondence with the size of the first substrate.

11. An operation management system for a semiconductor manufacture apparatus, comprising:

a plurality of drawing means prepared so as to be applicable to at least two substrate sizes and each used for drawing a circuit pattern of an arbitrary semiconductor device onto a first substrate;

a plurality of evaluation means prepared so as to be applicable to at least two substrate sizes and each used for evaluating the first substrate on which the circuit pattern of the semiconductor device is drawn;

a plurality of repair means prepared so as to be applicable to at least two substrate sizes and each used for repairing the first substrate on which the circuit pattern of the semiconductor device is drawn;

a plurality of pattern transfer means prepared so as to be applicable to at least two substrate sizes and each used for transferring the circuit pattern of the semiconductor device onto a second substrate; and operation management means for monitoring operating states of the drawing mans, the evaluation means, the repair means, and the pattern transfer means, and for operating all of the means, wherein the operation management means includes means for changing a size of the first substrate in accordance with a type of the circuit pattern of a semiconductor device to be manufactured and for selecting and operating a part or all of the drawing means, the evaluation means, the repair means, and the pattern transfer means in correspondence with the size of the first substrate.

* * * * *